(12) United States Patent
Azar et al.

(10) Patent No.: US 10,955,202 B2
(45) Date of Patent: Mar. 23, 2021

(54) COLD PLATE HEAT EXCHANGER

(71) Applicant: Advanced Thermal Solutions, Inc., Norwood, MA (US)

(72) Inventors: Kaveh Azar, Quincy, MD (US); Bahman Tavassoli-Hojati, Norton, MA (US); Anatoly Pikovsky, Sharon, MA (US)

(73) Assignee: Advanced Thermal Solutions, Inc., Norwood, MA (US)

( * ) Notice: Subject to any disclaimer, the term of this patent is extended or adjusted under 35 U.S.C. 154(b) by 299 days.

(21) Appl. No.: 15/635,282

(22) Filed: Jun. 28, 2017

(65) Prior Publication Data

US 2018/0003451 A1    Jan. 4, 2018

Related U.S. Application Data

(60) Provisional application No. 62/356,981, filed on Jun. 30, 2016.

(51) Int. Cl.

| | |
|---|---|
| *F28F 27/00* | (2006.01) |
| *H05K 7/20* | (2006.01) |
| *F28D 7/12* | (2006.01) |
| *F28F 3/12* | (2006.01) |
| *F28F 7/02* | (2006.01) |
| *H01L 23/473* | (2006.01) |
| *F28D 21/00* | (2006.01) |

(52) U.S. Cl.
CPC ............... *F28F 27/00* (2013.01); *F28D 7/12* (2013.01); *F28F 3/12* (2013.01); *F28F 7/02* (2013.01); *H01L 23/4735* (2013.01); *H05K 7/20254* (2013.01); *H05K 7/20927* (2013.01); *F28D 2021/0029* (2013.01); *F28F 2210/10* (2013.01); *F28F 2250/08* (2013.01); *F28F 2250/10* (2013.01)

(58) Field of Classification Search
CPC ...... F28F 27/00; F28F 3/12; F28F 7/02; F28F 2210/10; F28F 2250/08; F28F 2250/10; F28D 7/12; F28D 2021/0029; H01L 23/4735; H05K 7/20254; H05K 7/20927
USPC ......................................................... 165/287
See application file for complete search history.

(56) References Cited

U.S. PATENT DOCUMENTS

| | | | | |
|---|---|---|---|---|
| 1,018,711 | A * | 2/1912 | Kibby | F01P 3/20 |
| | | | | 122/32 |
| 6,286,331 | B1 * | 9/2001 | Lee | F25B 39/024 |
| | | | | 62/340 |

(Continued)

*Primary Examiner* — Tho V Duong
*Assistant Examiner* — Raheena R Malik
(74) *Attorney, Agent, or Firm* — Lieberman & Brandsdorfer, LLC

(57) ABSTRACT

Embodiments relate to a system with a primary body in communication with at least one heat source. A chamber housed within the primary body includes a boundary to separate the heat source from fluid contact and a secondary body housed in the chamber. The secondary body includes a conduit and a cover in communication with the conduit wherein the cover has a fluid flow inlet extending into the conduit and the conduit includes a series of convection ports to exhaust fluid into the chamber. Upon surging through the convection ports, the fluid comes in contact with the plenum of the primary body and dissipates the heat generated from the heat source and transferred to the primary body. An outlet, separate from the inlet, removes the fluid from the chamber.

19 Claims, 12 Drawing Sheets

(56) References Cited

U.S. PATENT DOCUMENTS

| | | | |
|---|---|---|---|
| 8,263,006 B2 * | 9/2012 | Sutherland | F28F 7/02 422/129 |
| 2002/0117294 A1 * | 8/2002 | Filippi | B01J 8/0285 165/170 |
| 2005/0241806 A1 * | 11/2005 | Liu | F28D 15/0266 165/104.21 |
| 2009/0094995 A1 * | 4/2009 | Braithwaite | A23L 3/361 62/63 |
| 2010/0328888 A1 * | 12/2010 | Campbell | H01L 23/4735 361/699 |
| 2011/0042041 A1 * | 2/2011 | Zrodnikov | F28C 3/005 165/104.19 |
| 2011/0141690 A1 * | 6/2011 | Le | H01L 23/4735 361/689 |
| 2012/0063091 A1 * | 3/2012 | Dede | H01L 23/4735 361/699 |
| 2012/0325447 A1 * | 12/2012 | You | F28F 3/048 165/170 |
| 2013/0058068 A1 * | 3/2013 | Funatsu | H05K 7/20927 361/820 |
| 2016/0183409 A1 * | 6/2016 | Zhou | H05K 7/20281 361/699 |

* cited by examiner

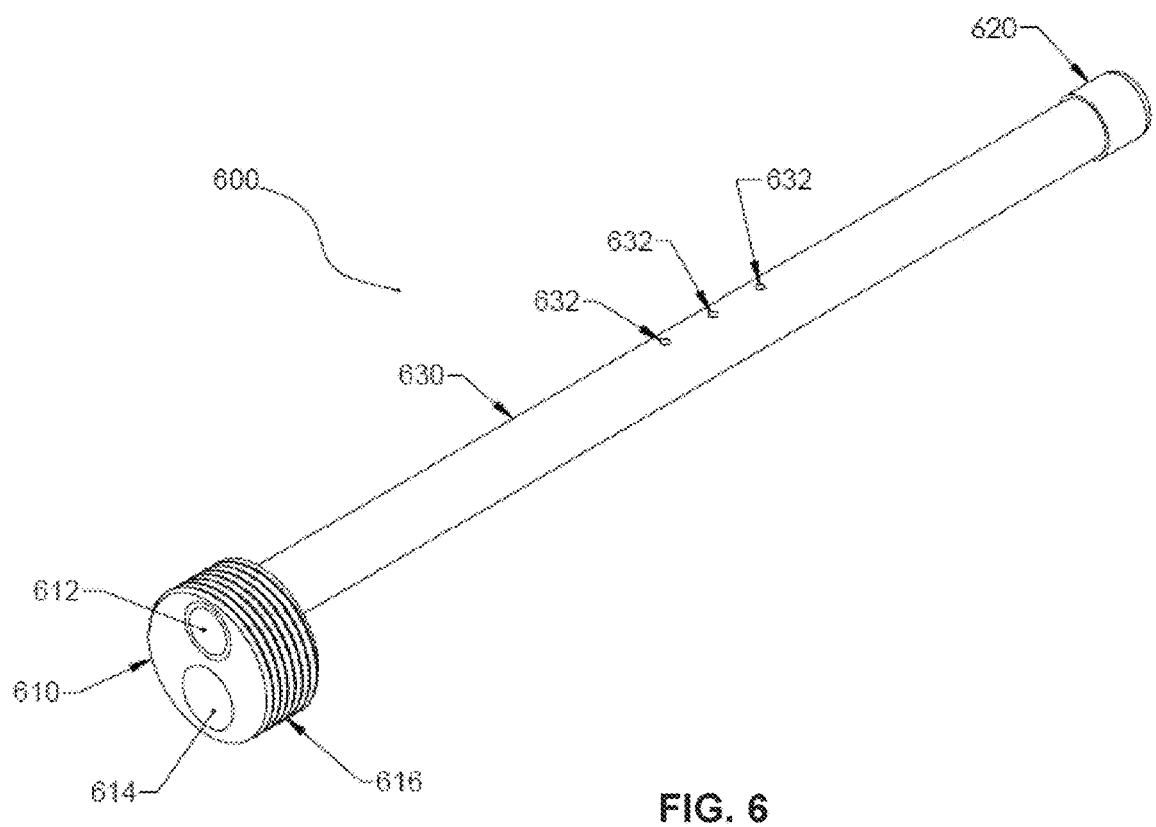
FIG. 6
FIG. 6A
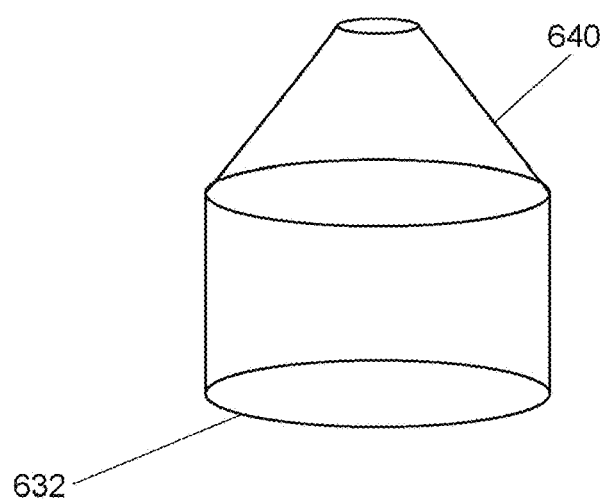

COLD PLATE HEAT EXCHANGER

CROSS REFERENCE TO RELATED APPLICATION(S)

This application is a non-provisional patent application claiming the benefit of the filing date of U.S. Provisional Patent Application Ser. No. 62/356,981, filed Jun. 30, 2016, and titled "Cold Plate Heat Exchanger" which is hereby incorporated by reference.

BACKGROUND

The present embodiment(s) relate to a cold plate heat exchanger with integrated jet impingement and fluid flow return. More specifically, the embodiment(s) relate to addressable components in the system and an associated control system to monitor the system, and communicate with the addressable components to modify performance in response to the monitoring.

A heat exchanger is an apparatus to transfer thermal energy from one medium to another without direct contact of the mediums. Heat exchangers may be found in applications requiring transfer of thermal energy between two fluids, a fluid and a gas, a fluid and a solid, or a gas and a solid. Due to the varied application of heat exchangers, there are various types, each type having different characteristics of heat transfer.

Cold plates are a type of heat exchanger designed to transfer heat from a solid heat source to a fluid in order to cool the heat source. Cold plates are generally employed in industrial environments for the cooling of large and small, heat-generating electronic, electrical or radio frequency components such as insulated-gate bipolar transistors, gate turn-off thyristors, and power modules. An objective of cold plates is to transport the heat from heat dissipating components as efficiently as possible while maintaining a low profile.

SUMMARY

A system and method are provided to support a cold plate heat exchanger.

In one aspect, a system is provided with a secondary chamber positioned within a primary body. The secondary chamber is provided in communication with a boundary that separate the primary body from fluid contact. A secondary body is positioned in the secondary chamber. The secondary body includes a conduit and an associated convection port. A fluid flows through the secondary body, fluid enters the secondary chamber through the convection port(s) and the fluid is exhausted from the secondary chamber through an outlet.

These and other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments and not of all embodiments unless otherwise explicitly indicated.

FIG. 6 depicts a perspective view of the secondary body.

DETAILED DESCRIPTION

It will be readily understood that the components of the present embodiments, as generally described and illustrated in the Figures herein, may be arranged and designed in a wide variety of different configurations. Thus, the following detailed description of the embodiments of the apparatus, system, and method, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment. Thus, appearances of the phrases "a select embodiment," "in one embodiment," or "in an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Figure 1:
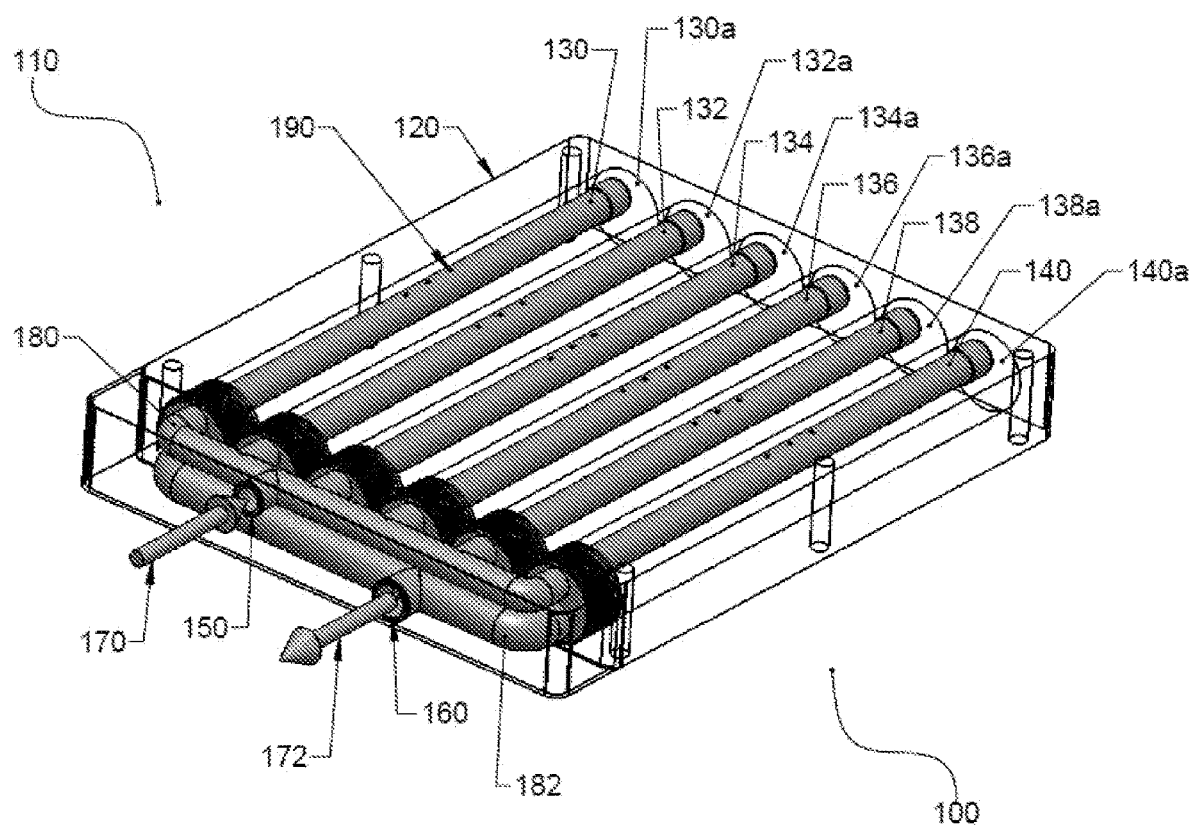
FIG. 1 depicts a block diagram illustrating a perspective view of a liquid cooling heat exchanger.

With reference to FIG. 1, a block diagram (100) is provided illustrating a perspective view of a liquid cooling heat exchanger (110). As shown, the heat exchanger (110) is shown with a primary body (120) with a plurality of secondary bodies (130)-(140) housed within secondary chambers (130a)-(140a), respectively. Although six secondary bodies (130)-(140) and six secondary chambers (130a)-(140a) are shown herein, this quantity should not be considered limiting. Each secondary body is in communication with an inlet (150) and an outlet (160). Fluid (170) enters the heat exchanger (110) through the inlet (150) and is dispersed through the secondary bodies (130)-(140). In one embodiment, and as shown herein, an inlet plenum (180), which in one embodiment may be an inlet manifold, functions as an interface between the inlet (150) and the secondary bodies (130)-(140) and an outlet plenum (182), which in one embodiment may be an outlet manifold, functions as an interface between the outlet (160) and the secondary chambers (130a)-(140a). In one embodiment, a valve (not shown) is positioned adjacent to each secondary body to separately control ingress of the fluid through the secondary bodies (130)-(140). Details of the valve and an associated control system are described below. In one embodiment, and as shown herein, each secondary body (130)-(140) is positioned in a secondary chamber (130a)-(140a) within the primary body (110). The secondary chambers effectively separate the interior of the primary body (110), with each secondary chamber configured to house a secondary body.

As described in detail below, fluid (170) enters the primary body (120) through inlet (150), and is dispersed into the secondary bodies (130)-(140) via the inlet plenum (180). In one embodiment, one or more valves (not shown) are employed to selectively control the fluid flow into the secondary bodies (130)-(140). Each secondary body (130)-(140) is configured with one or more convection ports (190) to further disperse fluid from the secondary body (130)-(140) into the respective secondary chamber (130a)-(140a). More specifically, in the embodiment with the secondary bodies (130)-(140) positioned in secondary chambers (130a)-(140a), respectively, the fluid is dispersed from the convection ports (190) into the secondary chambers (130a)-(140a). The flow rate of fluid (170) entering the system at inlet (150) supports egress of the fluid (172) through the outlet (160). The dispersing of fluid from the secondary bodies (130)-(140) enables the fluid to absorb heat byproduct from an associated heat source. In one embodiment, fluid (170) enters the system at a first temperature, and exits the system at a second temperature, with the fluid (172) at the exit having a higher temperature than at the entry. Accordingly, the heat exchanger (100) is configured with a primary body (110) configured to house a heat source, and a secondary bodies (130)-(140) to support fluid flow and effectively exchange heat received from the heat source.

Figure 2:
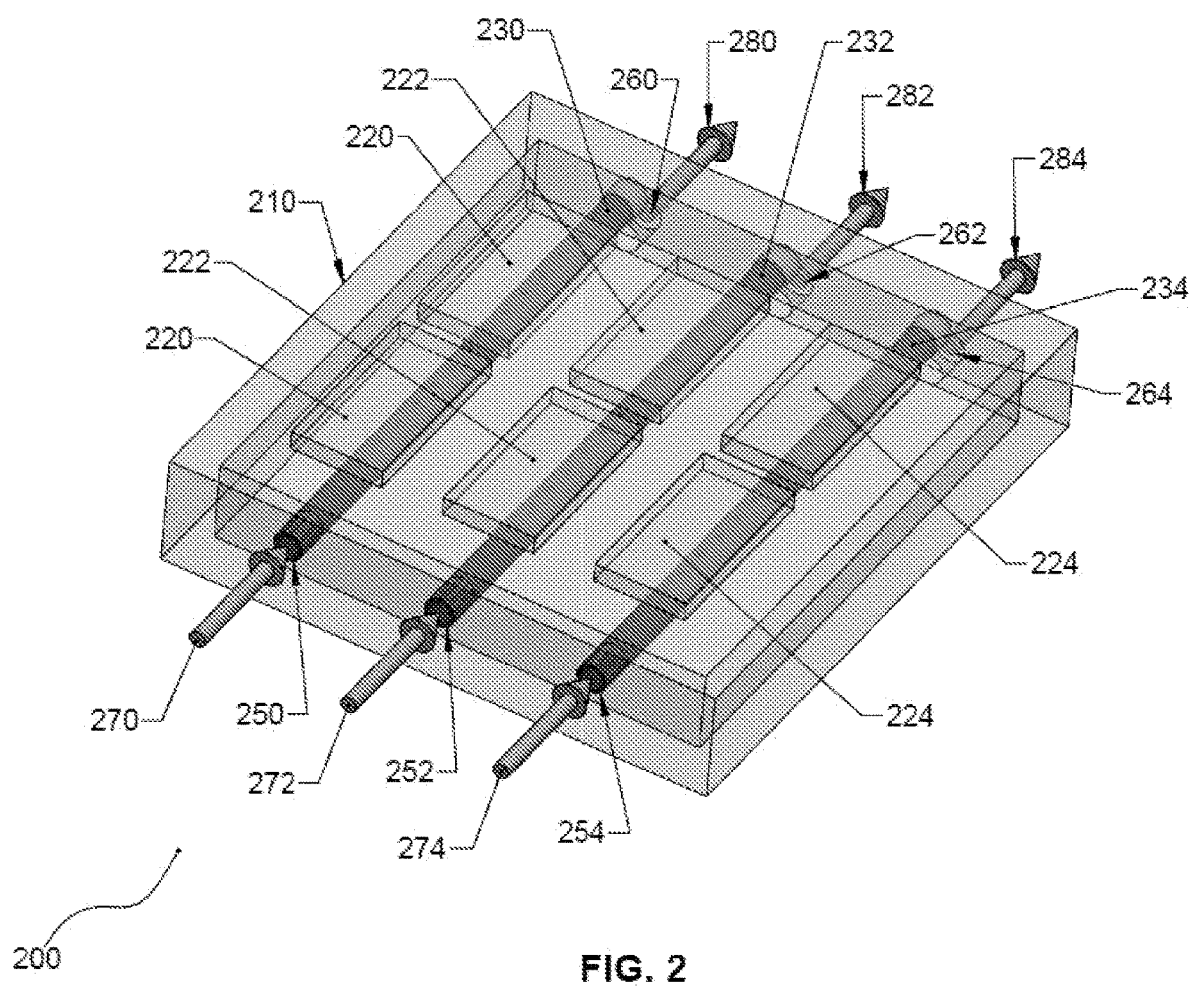
FIG. 2 depicts a perspective view of a liquid cooling heat exchanger with multiple secondary chambers and associated inlets.

The configuration of the liquid cooling heat exchanger is not a limiting embodiment. Referring to FIG. 2, a perspective view (200) is provided illustrating a liquid cooling heat exchanger with multiple secondary chambers and associated inlets. As shown, a primary chamber (210) is provided with a plurality of heat sources (220), (222), and (224) positioned in communication with the chamber (210). Three secondary bodies (230), (232), and (234) are positioned in a secondary chamber (212) positioned within the primary chamber (210). Details of the secondary body, also referred to as a convection tube, are shown and described in FIG. 6. Although three secondary bodies are shown herein, this quantity is for exemplary purposes and should not be considered limiting. Each secondary body is provided with an inlet and an outlet. As shown, body (230) includes inlet (250) and outlet (260), body (232) includes inlet (252) and outlet (262), and body (234) includes inlet (254) and outlet (264). Fluid is separately received by each secondary body via their respective inlet, and fluid is separately discharged from each secondary body via their respective outlet. More specifically, fluid (270) is received at inlet (250) of secondary body (230) and fluid (280) is discharged from outlet (260). Similarly, fluid (272) is received at inlet (252) of secondary body (232) and fluid (282) is discharged from outlet (262), and fluid (274) is received at inlet (254) of secondary body (234) and fluid (284) is discharged from outlet (264). Accordingly, each secondary body is positioned in the primary chamber and is configured with a separate inlet and outlet for receiving and discharging fluid.

Figure 3:
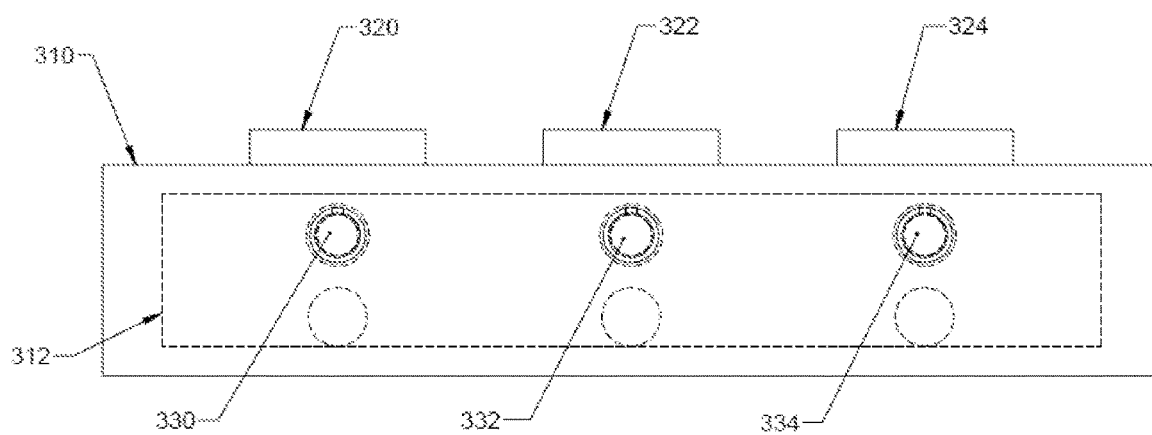
FIG. 3 depicts a cross section view of a liquid cooling heat exchanger with a primary chamber and a secondary chamber.

Referring to FIG. 3, a cross section (300) is provided illustrating a liquid cooling heat exchanger with a primary chamber and a secondary chamber. As shown, a primary chamber (310) is provided with a plurality of heat sources (320), (322), and (324) positioned in communication with the chamber (310). A secondary chamber (312) is positioned within the primary chamber (310). Three secondary bodies (330), (332), and (334) are positioned in the secondary chamber (312). Although three secondary bodies are shown herein, this quantity is for exemplary purposes and should not be considered limiting. Details of the secondary body, also referred to as a convection tube, are shown and described in FIG. 6. Each secondary body is provided with an inlet and an outlet. A detailed description of the inlet and outlet of the secondary bodies are shown and described in FIG. 2. Accordingly, multiple secondary bodies are positioned in the secondary chamber (312), which is housed within the primary chamber (310), with each secondary body configured with a separate inlet and outlet for receiving and discharging fluid.

Figure 4:
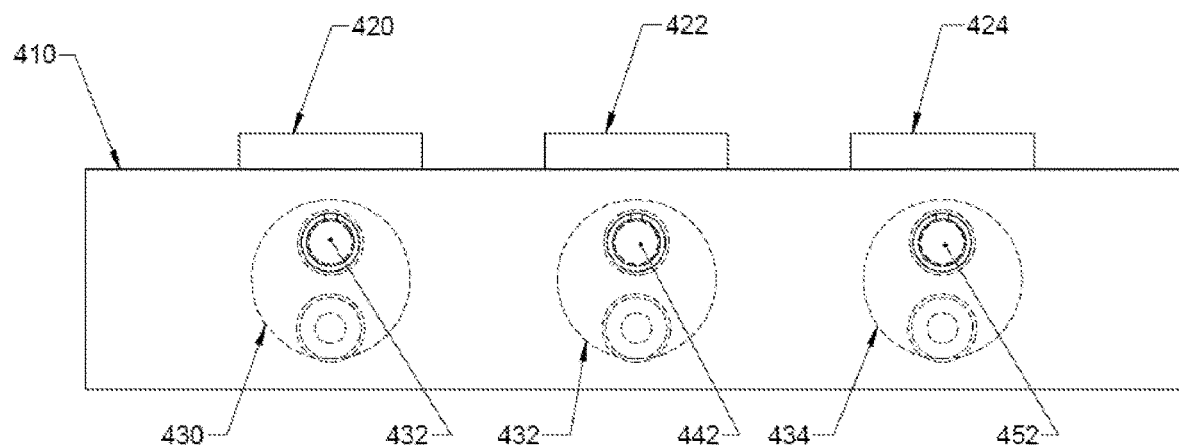
FIG. 4 depicts a cross section view of a liquid cooling heat exchanger with a primary chamber and multiple secondary chambers.

Referring to FIG. 4, a cross section (400) is provided illustrating a liquid cooling heat exchanger with a primary chamber and multiple secondary chambers. As shown, a primary chamber (410) is provided with a plurality of heat sources (420), (422), and (424) positioned in communication with the chamber (410). Multiple secondary chambers (430), (440), and (450) are positioned within the primary chamber (410). Each secondary chamber is configured to receive a secondary body. As shown, secondary body (432) is positioned in secondary chamber (430), secondary body (442) is positioned in secondary chamber (440), and secondary body (452) is positioned in secondary chamber (450). Although three secondary bodies are shown herein, this quantity is for exemplary purposes and should not be considered limiting. Details of the secondary body, also referred to as a convection tube, are shown and described in FIG. 6. Each secondary body is provided with an inlet and an outlet. A detailed description of the inlet and outlet of the secondary bodies are shown and described in FIG. 2. Accordingly, multiple secondary chambers are positioned in a primary chamber, with each secondary chamber in receipt of a separate secondary body.

Figure 5:
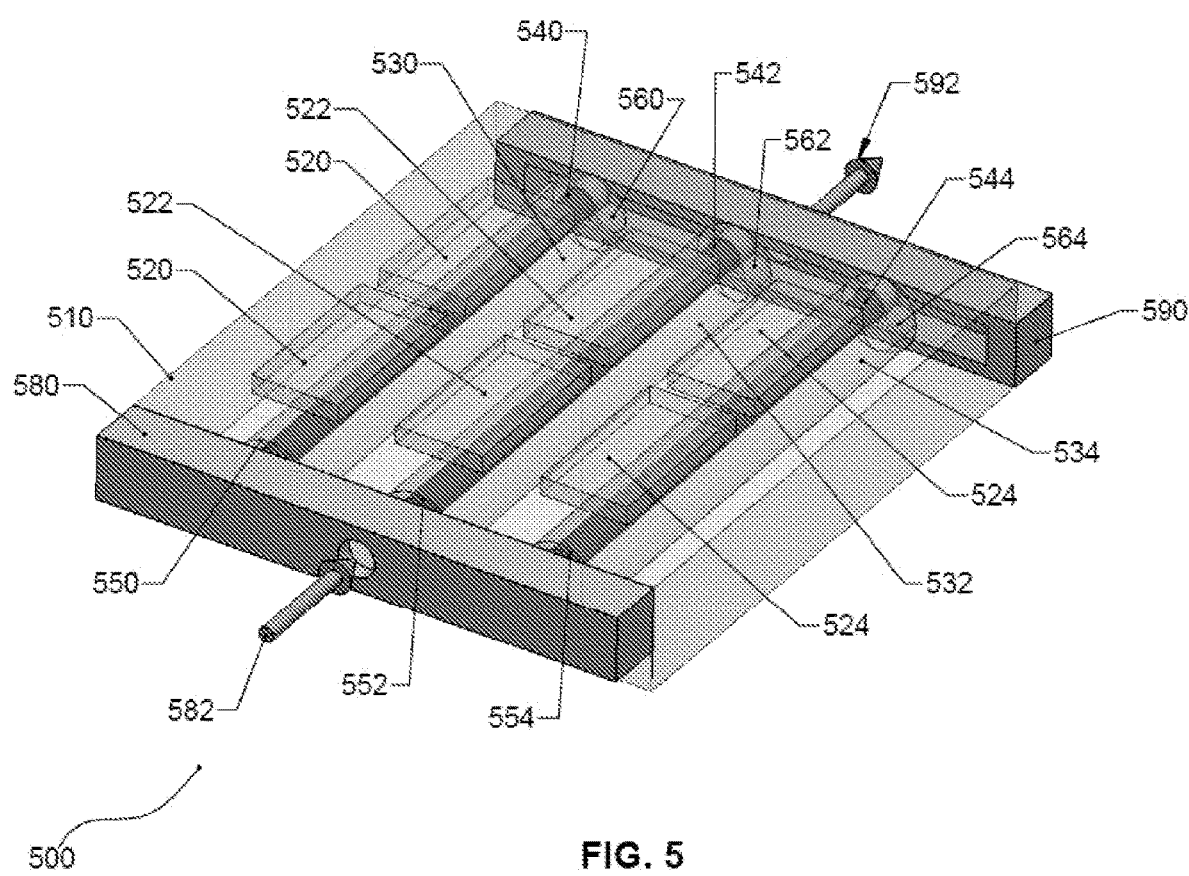
FIG. 5 depicts a perspective view of an embodiment of the system shown in FIG. 1 illustrating a liquid cooling heat exchanger with multiple secondary chambers and inlet and outlet manifolds for directing the fluid.

As shown in FIGS. 1-4, fluid may be delivered directly from an inlet to a corresponding outlet. Referring to FIG. 5, a perspective view of an embodiment of the system shown in FIG. 1 is provided illustrating a liquid cooling heat exchanger with multiple secondary chambers and inlet and outlet manifolds for directing the fluid. As shown, a primary chamber (510) is provided with a plurality of heat sources (520), (522), and (524) positioned in communication with the chamber (510). Three secondary chambers (530), (532), and (534) are positioned within the primary chamber (510). Each secondary chamber is shown housing a secondary body (540), (542), and (544), respectively. Details of the secondary body, also referred to as a convection tube, are shown and described in FIG. 5. Although three secondary bodies are shown herein, this quantity is for exemplary purposes and should not be considered limiting. Each secondary body is configured with a proximal end and an oppositely disposed distal end. Specifically, each secondary body has proximal end (550), (552) and (554), respectively, and distal ends (560), (562), and (564), respectively. A body inlet is positioned adjacent to each proximal end, and a body outlet is positioned adjacent to each distal end.

An inlet plenum (580), which in one embodiment may be in the form of an inlet manifold, is provided to deliver inlet fluid (582) to each of the secondary bodies via their respective inlets. Similarly, an outlet plenum (590), which in one embodiment may be in the form of an outlet manifold, is provided to exhaust fluid (592) from each of the secondary bodies via outlet plenum (590). Inlet fluid (582) is directed from a fluid source to the inlet plenum (580) and separately received by each secondary body via their respective inlet, and fluid is separately discharged from each secondary body via their respective outlets to the outlet plenum (590) and discharged from the system via outlet (592). Accordingly, inlet and outlet plenums are provided to facilitate delivery and discharge of fluid, and as shown herein may be positioned on different ends of the primary chamber (510).

Each secondary body is configured to deliver heat exchange fluid proximal to one or more heat sources. Referring to FIG. 6, a perspective view of a secondary body (600) is provided. As shown, the secondary body (600) is elongated and is configured with a proximal end (610) and a distal end (620) with a conduit (630) extending there between. The proximal end (610) is configured with an inlet (612) and an outlet (614). The inlet (612) is configured to receive fluid from an external source (not shown). Furthermore, the inlet (612) is shown having a linear relationship with the conduit (630), also referred to herein as a direct connection to the conduit (630), such that fluid enters the inlet (612) and pressure associated with the fluid flow directs the fluid into the conduit (630). As further shown, the outlet (614) is not in direct communication with the conduit (630). More precisely, the conduit (630) is represented to have a smaller cross section than the proximal end (610), with the direct connection limited to the inlet (612). The conduit (630) is shown herein with a plurality of openings (632), also referred to herein as ports (632). Details of the positioning and geometrical configuration of the openings are described below. In general, each opening (632) functions as a convection port to exhaust fluid into the chamber that houses the secondary body. In one embodiment shown in FIG. 6A, a nozzle (640) shown as a cone may be positioned in communication with one or more of the port, with the nozzle functioning to direct fluid from the secondary body (600) into a proximally positioned secondary chamber. The exhaustion of the fluid into the associated chamber enables fluid to approach the heat source without contacting the heat source, such that the temperature of the fluid increases. The flow rate of the fluid directs the fluid to the outlet (614) for egress from the associated chamber. Accordingly, the outlet (614) is in direct communication with the associated chamber and functions to remove fluid from the system.

The fluid entering the secondary body functions as a coolant for heat exchange. In one embodiment, fluid entering the secondary body has an associated temperature, referred to herein as an inlet temperature, and an associated inlet pressure that supports the flow rate of the fluid. As the fluid exits the conduit (630) into the associated chamber, the fluid is exposed to heat byproduct from a heat source, which effectively increases the temperature of the fluid. The fluid flow directs the fluid from the associated chamber to the outlet (614). The fluid exiting the outlet (614) has an associated temperature, referred to herein as an exit temperature. In one embodiment, the exit temperature is greater than the inlet temperature. As further shown, each secondary body (600) has a threaded exterior (616) adjacent to the proximal end (610). The threading (616) enables the secondary body (600) to be connected or disconnected from the system. For example, in one embodiment, the secondary body (600) may be removed for evaluation and/or cleaning. The secondary body (600) may be removed, cleaned, replaced, etc., without requiring disassembly of the system in its entirety. In other words, the threading (616) supports the modular characteristic of the secondary body (600) so that each secondary body (600) may be individually removed from the system without affecting the operability or integrity of the system.

Figure 7:
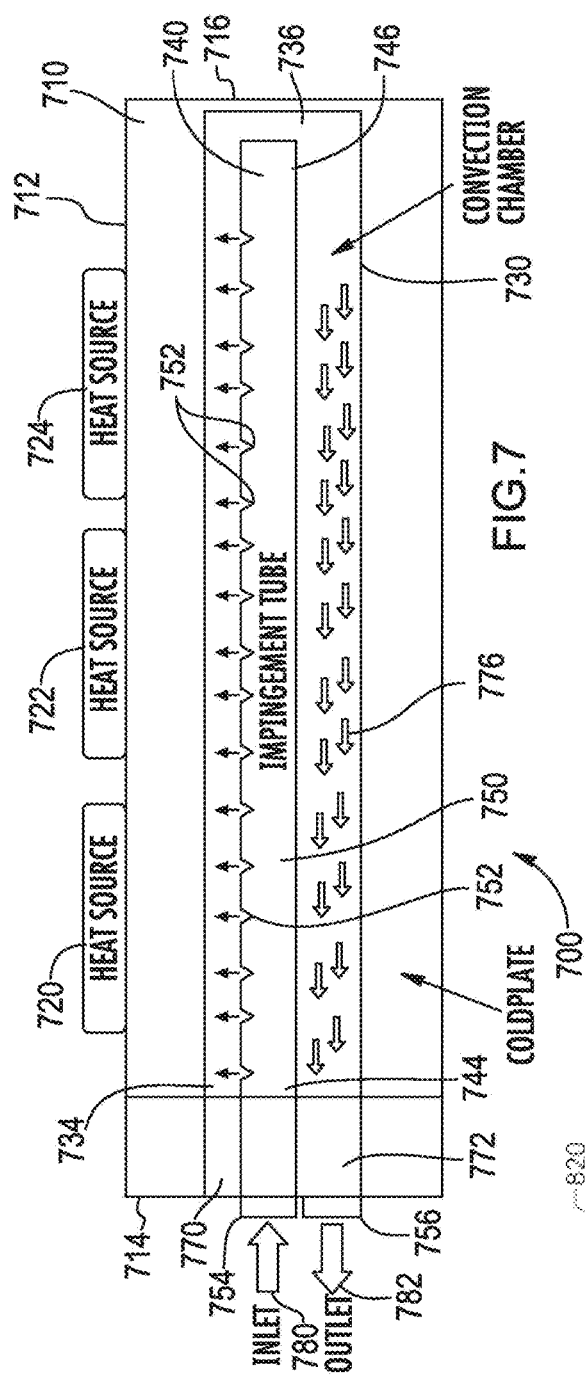
FIG. 7 depicts a cross section of the system of FIG. 1 taken from a side view.

Referring to FIG. 7, a cross section (700) of the system of FIG. 1 taken from a side view is provided. As shown, a primary body (710) is provided in communication with a plurality of heat sources (720), (722), and (724). Although three heat sources are shown, this quantity should not be considered limiting. The heat sources (720)-(724) are shown positioned on a top surface (712) of the primary body. In one embodiment, the primary body (710) is comprised of Aluminum, or a material with similar properties, that enable the body to support the heat sources (720)-(724) while having a relatively high degree of thermal conductivity. It is understood that Aluminum is a conductor of heat, and as such absorbs heat generated by the heat sources (720)-(724). Accordingly, the primary body (710) absorbs heat generated by the one or more heat sources (720)-(724).

In the cross-sectional view provided herein, the primary body (710) is shown with a secondary chamber (730), and a secondary body (740) positioned in the secondary chamber (730). The primary body (710) is shown with a proximal end (714) and a distal end (716). Similarly, the secondary chamber (730) is configured with a proximal end (734) and a distal end (736). As shown, the secondary chamber (730) is configured in an alignment with the primary body (710). Similarly, the secondary body (740) is configured with a proximal end (744) and a distal end (746). The secondary body (740) is configured with a conduit (750) that extends from the proximal end (744) to the distal end (746). More specifically, the proximal end (744) is in communication with an inlet plenum (770), which in one embodiment may be an inlet manifold, and functions as an interface with the fluid inlet (754) to introduce and deliver fluid (780) to the secondary body (740). The proximal end (744) is also in communication with an exit plenum (772), which in one embodiment may be an exit manifold and functions as an interface with the fluid outlet (756) to exhaust fluid (782) from the secondary body (740). Accordingly, the secondary body (740) is positioned within the secondary chamber (730).

The proximal end (744) of the secondary body (740) is shown positioned in communication with both the inlet and outlet plenums (770) and (772), respectively, which are both separately in direct communication with the inlet (754) and outlet (756), respectively. In one embodiment, the inlet plenum (770) may include a separate communication between the fluid inlet (754) and the fluid outlet (756). The inlet (754) is aligned with inlet plenum (770), which interfaces between the conduit (750) and inlet (754). The secondary body (740) is positioned in the secondary chamber (730) such that the proximal end (744) of the secondary body (740) is aligned with the proximal end (714) of the primary body (710), and the distal end (746) is positioned within the secondary chamber (730) and adjacent to the distal end (716) of the primary body (710).

The inlet (754) functions to deliver fluid from a fluid source (not shown) to the secondary chamber (730) via the secondary body (740). Fluid flow is represented with arrows to illustrate the direction of the flow. More specifically, the fluid flow is shown entering the system and directed into the secondary chamber (730). As shown, the fluid flow enters the secondary chamber through inlet (754) and inlet plenum (770), which directs the fluid into the secondary body (740). The flow of the fluid advances the fluid from the inlet (754) and into the conduit (750).

As shown herein, the conduit (750) is configured with a plurality of ports (752) positioned along the length of the conduit (750). Each port (752) functions as a nozzle to direct the fluid from the conduit (750) and into the secondary chamber (730). As shown in FIG. 6, in one embodiment, a secondary nozzle may be placed in communication with the port (752) to facilitate control of the fluid flow from the secondary body to the secondary chamber. In one embodiment, the ports (752) and/or nozzle function to control the direction and characteristics of the fluid flow as it exits the conduit (750) and enters the secondary chamber (730). For example, in one embodiment, the shape, positioning, and/or distribution of the ports (752) may be modified to contribute to the control and direction of the fluid flow. The shape of the ports may be uniform or varied, and the position of the ports along the secondary body may be uniformly space, or varied spacing there between. Similarly, in an embodiment with at least two secondary bodies, the port(s) of the first body are referred to as the first port(s), and the port(s) of the second body are referred to as the second port(s). Each of the first and second ports has an associated shape. These shapes may be different or similar, and the size of the first and second ports may be similar or different. Aspects of the ports may be configured and/or selected depending on the system. In one embodiment, a secondary nozzle is provided in communication with a port, with the secondary nozzle functioning to direct fluid from the secondary body into the secondary chamber (730). As shown herein, the fluid flow is directed from the conduit (750) into the secondary chamber (730), as shown at (754), and as further shown the fluid flow is directed from the conduit (750) at (718).

The fluid in the fluid flow can come from a variety of sources, and in general is not subject to heating prior to entry into the secondary chamber. When the fluid flow is directed to the plenum (708), the fluid is subject to heat byproduct from one or more of the heat sources (720)-(724). Heat exchange takes place in the form of the temperature of the fluid increasing as the fluid is exposed to the heat byproduct. At the same time, the fluid continues to flow through the secondary chamber (730). More specifically, the fluid enters the chamber at a flow rate, and the fluid flows through the chamber at or near the flow rate, or in one embodiment a dissipating flow rate. In one embodiment, continued flow of fluid entering the system contributes to maintenance of the flow rate. As shown herein, the fluid flow) exits the conduit (750) and continues in the direction represented at (776) and to the outlet plenum (772) which is in communication with outlet (756). Fluid flow (776) represents the fluid as it exits the secondary chamber (730). As new fluid enters the secondary chamber (730), pressure associated with the fluid and the inherent flow rate, directs the fluid flow from the secondary chamber (730) to the associated outlets. Accordingly, as shown herein, the fluid in the secondary chamber (730) absorbs heat from the heat sources (720)-(724), and as the fluid exits the secondary chamber (730), the fluid with the increased temperature is exhausted from the system.

Figure 8:
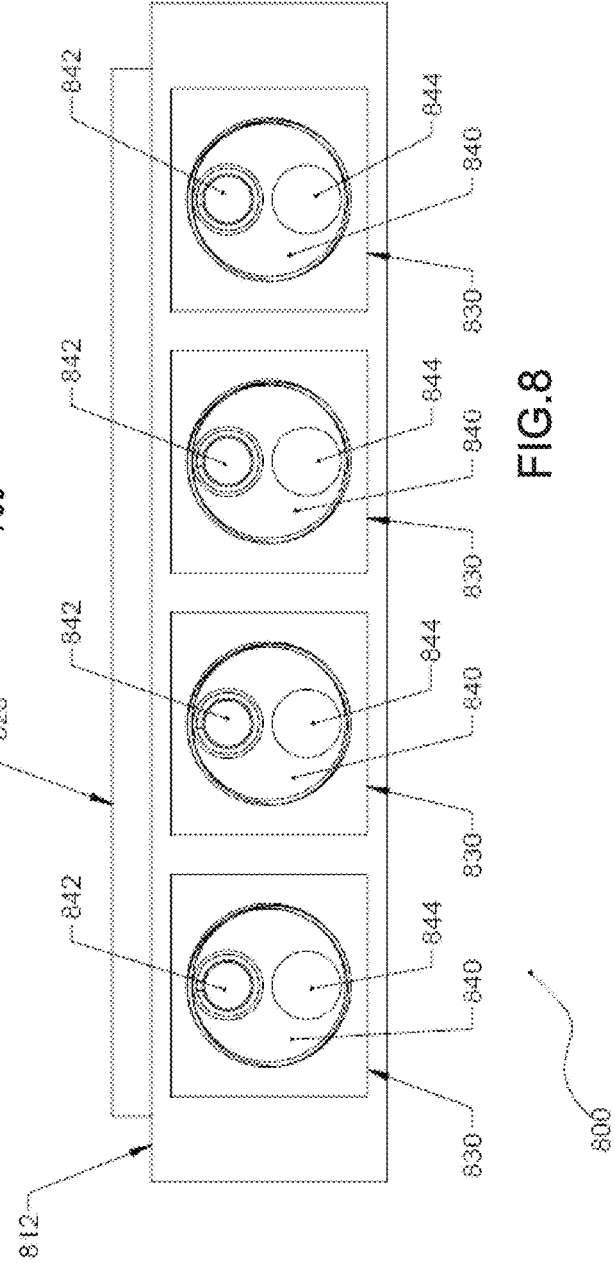
FIG. 8 depicts a cross section of the system of FIG. 1 taken from a front view.

Referring to FIG. 8, a block diagram (800) is provided illustrating a cross-section of one embodiment of the system of FIG. 1 taken from a front view. As shown, a primary body (810) is provided in communication with a heat source (820). Although only one heat source is shown in this view, in one embodiment, a plurality of heat sources may be provided in communication with the primary body (810). The heat source (820) is shown positioned on a top surface (812) of the primary body (810). The primary body (810) is shown with a plurality of secondary chambers (830), with each secondary chamber (830) in receipt of a secondary body (840) positioned in the secondary chamber (830). Each secondary body (840) is configured with an inlet (842) and an outlet (844). As shown in FIG. 6, the inlet (842) functions as an entry for fluid into the secondary chamber (830), and the outlet (840) functions as an exit for the fluid. As the fluid passes through the secondary chamber (830), the fluid absorbs heat byproduct from the heat source (820). In one embodiment, the absorption is memorialized in a temperature increase of the fluid, such that the fluid exits the secondary chamber (830) at a temperature higher than when the fluid entered the secondary chamber (830). Accordingly, the secondary chamber (830) functions as a conduit to enable heat exchange with one of more heat sources. The inlets (842) as well as outlets (844) can be directly connected to separate fluid sources (not show) and outlets (not shown) or connected to inlet and outlet plenums, which in effectively function as a unit to manage fluid flow to and from an associated inlet and outlet.

Figure 9:
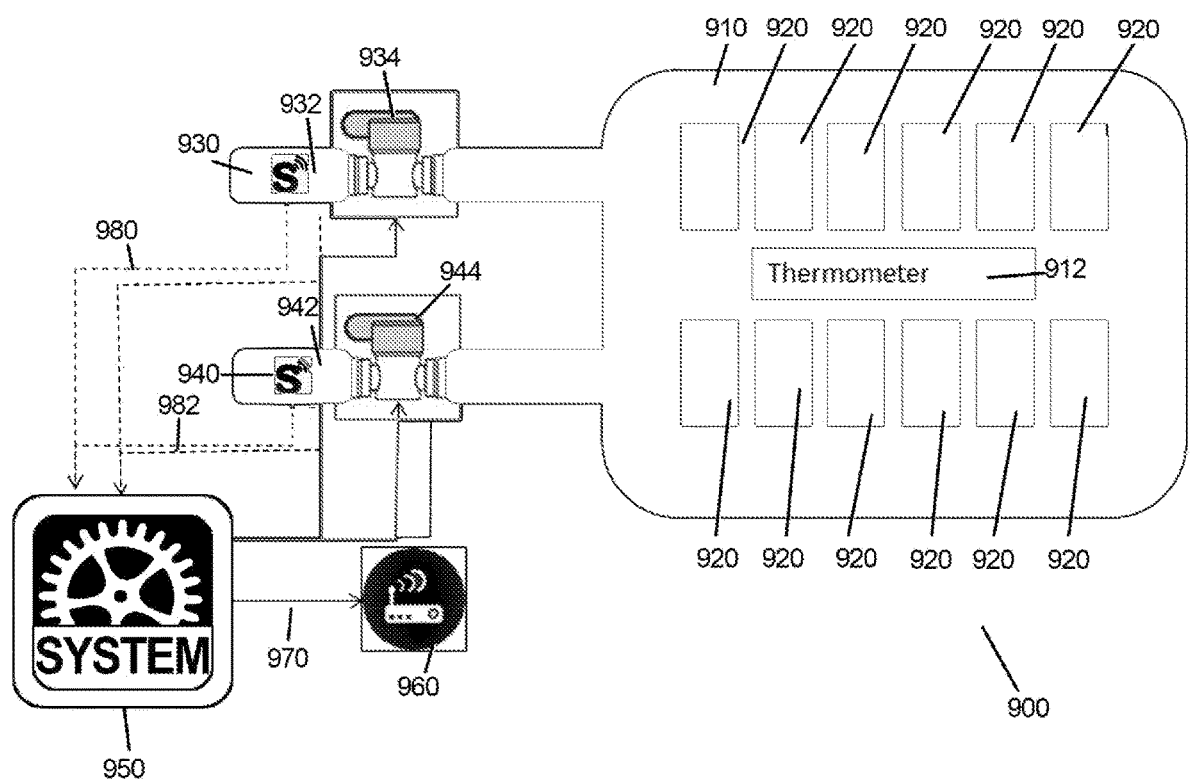
FIG. 9 depicts a block diagram illustrating control of the fluid flow with respect to the heat exchange system.

The modular design of the secondary body with respect to the primary body enables control of the heat exchange. Referring to FIG. 9, a block diagram (900) is provided illustrating control of the fluid flow with respect to the heat exchange system. As shown, a primary body (910) is provided with a plurality of heat sources (920). Although not shown, the primary body (910) at least one secondary body positioned in either a primary or secondary chamber, as described above. As shown herein, flow ingress and egress is in communication with an associated control system. More specifically, fluid flow enters the system at (930) and exits the system at (940). Both the inlet and the outlet are configured with a valve and a sensor. More specifically, the inlet (930) is configured with a sensor (932) and an associated fluid flow control (934), which in one embodiment may be a valve, and the outlet (940) is configured with a sensor (942) and an associated fluid flow control (944), which in one embodiment may be a valve. Each of the sensors (932), (942) and the fluid flow controls (934), (944) are in communication with a control system (950). The sensor (932) functions to detect a fluid leak or pressure drop in the fluid entering the system, and similarly, the sensor (942) functions to detect a fluid leak or pressure drop in the fluid exiting the system. Each of the sensors (932) and (942) are in communication with the control system (950). In one embodiment, the sensors (932) and (942) measure characteristics of the fluid flow and report the measurements to the control system. In one embodiment, the measurements and associated reporting may take place on a periodic basis at a set frequency, with the control system managing setting and/or changing the frequency. Similarly, in one embodiment, the control system may request a measurement on demand. Accordingly, the control system (950) functions to communicate with the sensors to acquire fluid flow measurements and associated characteristics.

As further shown, the control system (950) is in communication with a remote computer system (960) across a communication channel (970). In one embodiment, the communication channel is wireless. Each flow control (934), (944) may be referred to as a smart valve, which is shown herein in communication with the control system (950) across communication channels (980) and (982), respectively. More specifically, each flow control (934), (944) functions to control fluid flow through their associated conduit. The smart aspect of the valve enables the control system to manage the associated fluid flow by changing the position of the valve, such as control a position of the valve to place the valve in a completely open or closed or to place the valve in a partially open or closed position. In one embodiment, the primary body (910) is configured with a thermometer (912) to assess the temperature of the body (910), with the thermometer in communication with the control system (950). As the temperature of the body (910) increases or decreases, the thermometer (910) communicates these changes to the control system (950), which manages the fluid flow controls (934) and (944) to increase or decrease the associated fluid flow. The sensors (932), (942), and thermometer (912) electronically report to the control system (950), with the control system communicating with the fluid flow controls (934) and (944) to manage fluid flow through the primary chamber based on fluctuations of the reported measurements.

Figure 10:
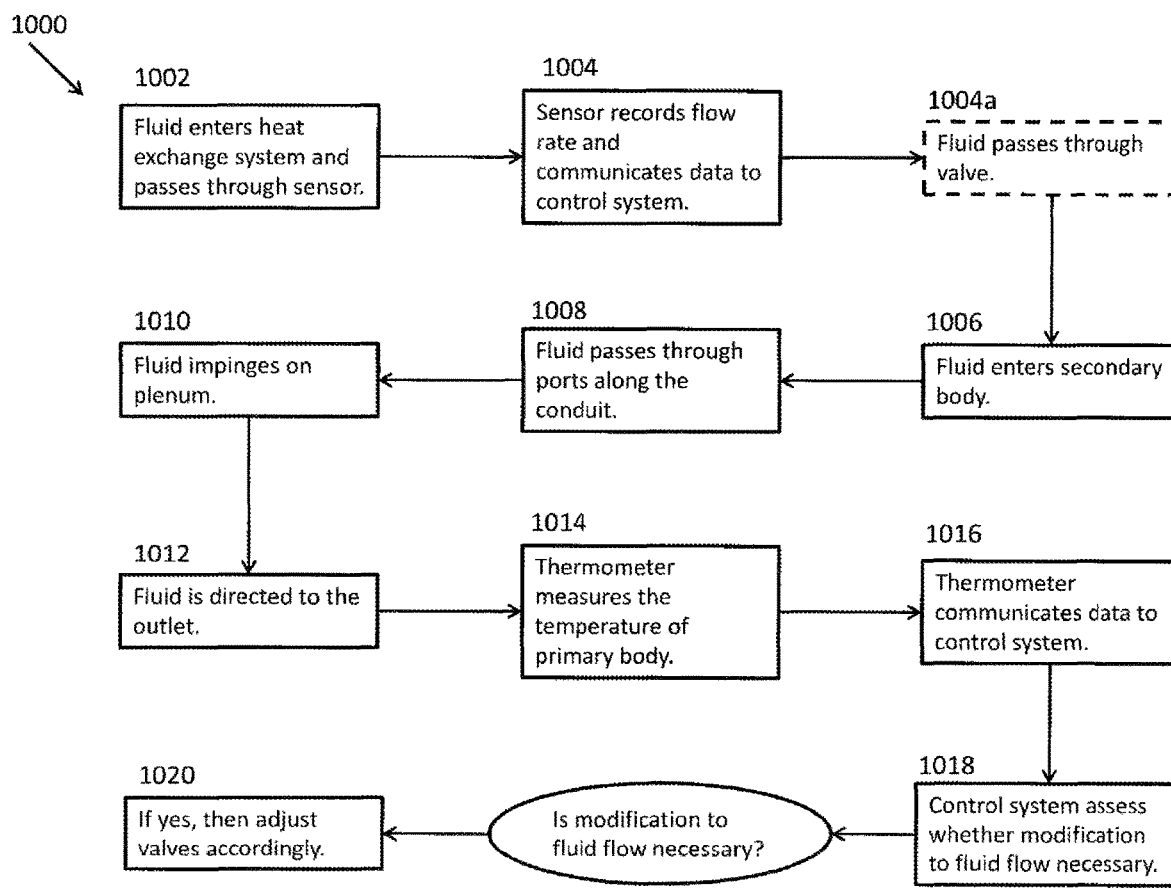
FIG. 10 depicts a flow chart illustrating a process for managing the heat exchange system shown in FIGS. 1-9.

Referring to FIG. 10, a flow chart (1000) is provided illustrating a process for managing the heat exchange system shown in FIGS. 1-9. Fluid from a fluid source enters the heat exchange system (1002). During this entry process, the fluid passes through a sensor (1002) which records the associated flow rate and communicates the flow rate to an associated control system (1004). In one embodiment, passage of fluid may be enabled or disabled based on a position or changed position of a valve (1004a). For example, in one embodiment, fluid may enter the system configured with a plurality of secondary bodies, and each secondary body having a respective secondary valve. Fluid may only enter the secondary bodies with a valve set to an open position. Upon entry of the fluid into the secondary body (1006), the fluid passes through the ports along the conduit of the secondary body (1008) and impinges on a plenum, e.g. the interior wall of the primary chamber (1010). Based on the flow rate of the fluid and flow rate of fluid continuing to enter the secondary chamber, the fluid that impinged the plenum is directed to the outlet (1012). At the same time, a thermometer in communication with the primary chamber or the heat generating devices measures the temperature of the referenced body (1014) and communicates the measurement to the control system (1016). As shown in FIG. 9, the control system manages the temperature of the primary body by adjusting the fluid flow, which in one embodiment takes place by controlling a position of the valves.

The state of the system is communicated to the control system on a periodic basis, or in one embodiment on-demand. For example, the control system can set a frequency to receive temperature readings. In one embodiment, the control system can modify the frequency. Similarly, in one embodiment, the control system may obtain the temperature measurement on-demand. Based on the temperature reading, the control system assesses if modifications to the fluid flow are required in order to attain a desirable temperature reading (1018). A negative response to the assessment at step (1018) will follow with the heat exchange system and associated flow control valves remaining in their current positions. Similarly, a positive response to the assessment at step (1018) is followed by adjustment of one or more of the valves (1020). Accordingly, the control system may utilize temperature readings and communicate a signal to the one or more of the valves in response to the reading, with the signal adjusting a position of the associated valve.

Figure 11:
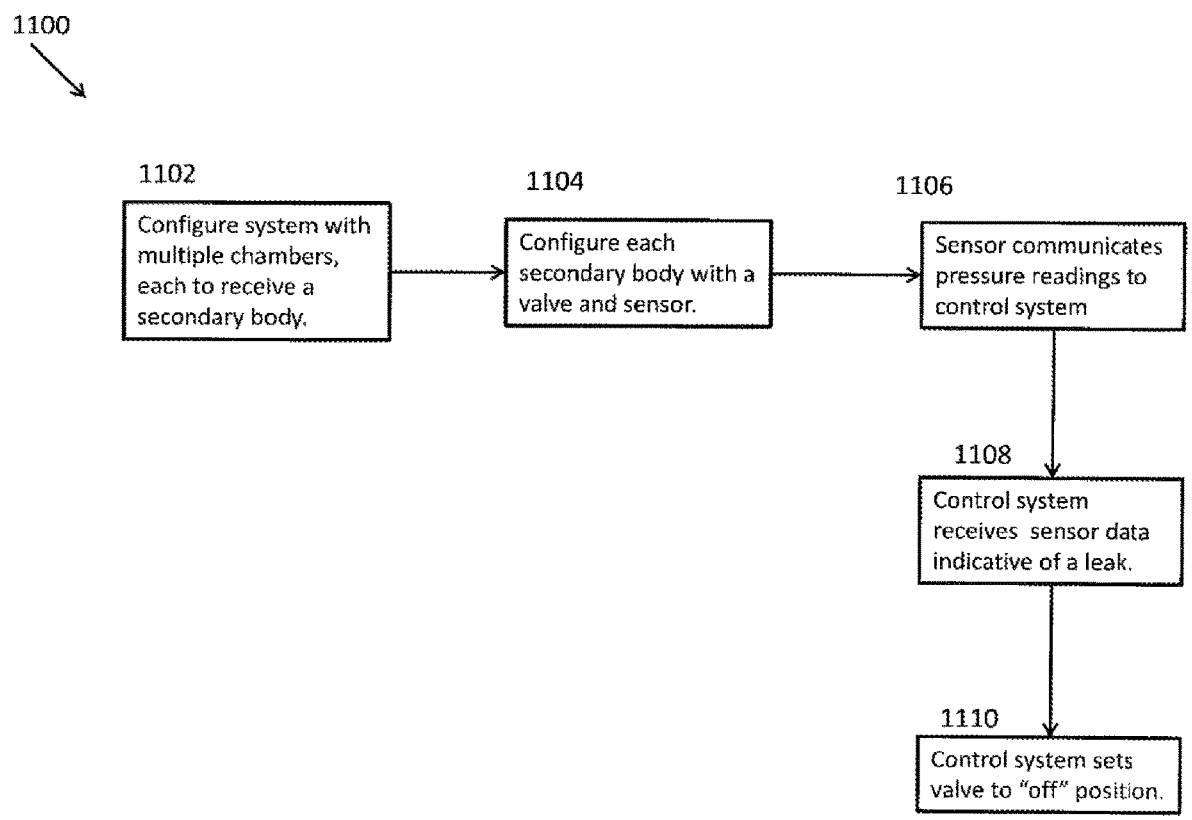
FIG. 11 depicts a flow chart illustrating a process for the control system to manage fluid flow in the heat exchange system shown in FIG. 1.

The heat exchanger may employ sensors to detect characteristics of the fluid flow. FIG. 11 is a flow chart (1100) illustrating a process for the control system to manage fluid flow in the heat exchange system shown in FIG. 1. The system is configured with multiple secondary chambers, each configured to receive a secondary body (1102). Similarly, each secondary body is configured with a valve and an associated sensor placed adjacent to the secondary chamber inlet (1104). The sensor functions to assess pressure of the fluid flow entering the secondary chamber. The sensor communicates fluid flow pressure readings to the control system (1106). The readings may be reported on a set frequency. In one embodiment, the frequency may be modified. Similarly, in one embodiment, the control system may obtain the fluid flow pressure readings on demand. Each valve has an associated address so that the control system may communicate with a designated valve. At such time as the control system receives sensor data indicative of a leak or pressure drop (1108), the control system may adjust the associated valve (1110). For example, in one embodiment, at step (1110) the control system may set the valve to an off position to further investigate the cause or source of the detected leak or pressure drop. Similarly, at step (1110), the control system may set the associated valve to an off position, and at the same time adjust a second valve associated with a second secondary chamber in the heat exchange system to compensate for setting one of the valves to the off position. Accordingly, the control system may adjust the fluid flow through adjustment of one or more valves.

Figure 12:
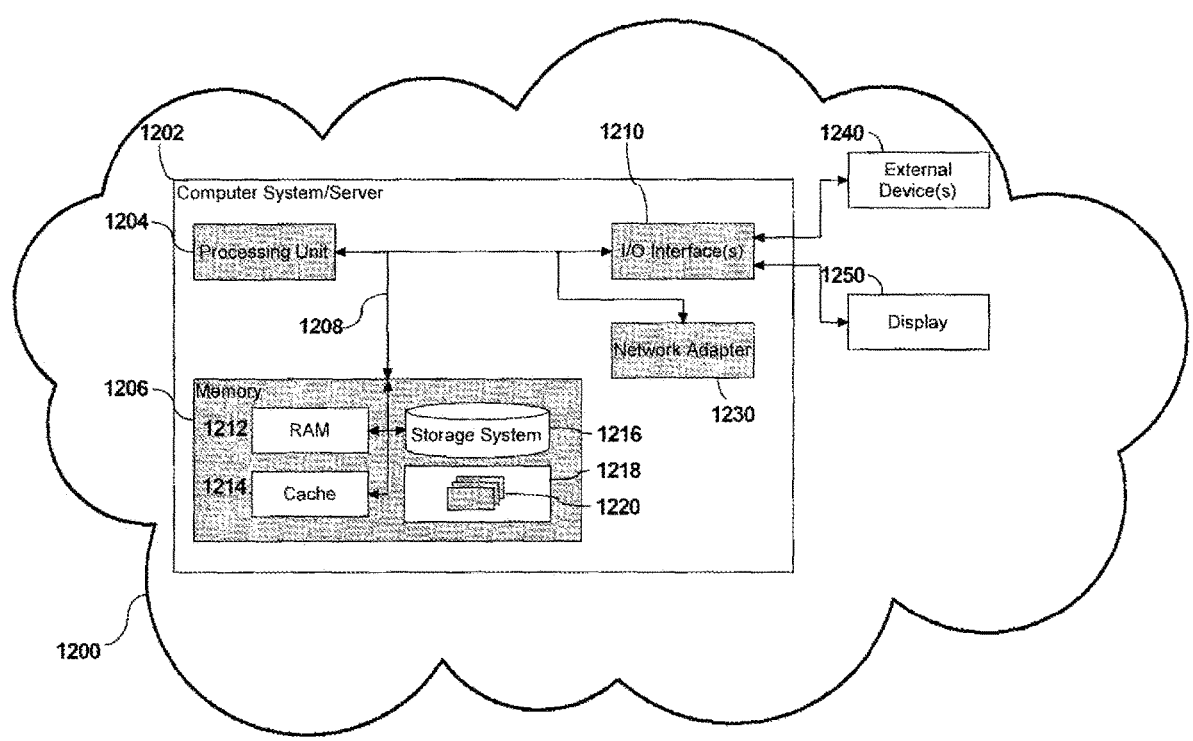
FIG. 12 depicts a block diagram illustrating a node of a cloud computing environment.

The control system shown and described in FIGS. 10 and 11 may be utilized to support energy savings based on cooling system management. More specifically, the control system may be in communication with a remote computer system through a wireless communication protocol. With reference to FIG. 12, a block diagram (1200) is provided illustrating an example of a computer system/server (1202), hereinafter referred to as a node (1202) to communication with the control system and manage fluid flow through the cold plate heat exchanger, as shown and described in FIGS. 1-11. In one embodiment, node (1202) may be a computing node of a cloud computing environment. Node (1202) may be a server associated with a client machine, streaming media provider, contextual personalized content delivery service, or streaming media device, as discussed herein above. Node (1202) is operational with numerous other general purpose or special purpose computing system environments or configurations. Examples of well-known computing systems, environments, and/or configurations that may be suitable for use with node (1202) include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and filesystems (e.g., distributed storage environments and distributed cloud computing environments) that include any of the above systems or devices, and the like.

Node (1202) may be described in the general context of computer system-executable instructions, such as program modules, being executed by a computer system. Generally, program modules may include routines, programs, objects, components, logic, data structures, and so on that perform particular tasks or implement particular abstract data types. Node (1202) may be practiced in distributed cloud computing environments where tasks are performed by remote processing devices that are linked through a communications network. In a distributed cloud computing environment, program modules may be located in both local and remote computer system storage media including memory storage devices.

As shown in FIG. 12, node (1202) is shown in the form of a general-purpose computing device. The components of node (1202) may include, but are not limited to, one or more processors or processing units (1204), a system memory (1206), and a bus (1208) that couples various system components including system memory (1206) to processor (1204). Bus (1208) represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Node (1202) typically includes a variety of computer system readable media. Such media may be any available media that is accessible by node (1202) and it includes both volatile and non-volatile media, removable and non-removable media.

Memory (1206) can include computer system readable media in the form of volatile memory, such as random access memory (RAM) (1212) and/or cache memory (1218). Node (1202) further includes other removable/non-removable, volatile/non-volatile computer system storage media. By way of example only, storage system (1216) can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus (1208) by one or more data media interfaces. As will be further depicted and described below, memory (1206) may include at least one program product having a set (e.g., at least one) of program modules that are configured to carry out the functions of the embodiments described herein.

Program/utility (1218), having a set (at least one) of program modules (1220), may be stored in memory (1206) by way of example, and not limitation, as well as an operating system, one or more application programs, other program modules, and program data. Each of the operating systems, one or more application programs, other program modules, and program data or some combination thereof, may include an implementation of a networking environment. Program modules (1220) generally carry out the functions and/or methodologies of embodiments described herein. For example, the set of program modules (1220) may include at least one module that is configured to contextualize media, or present relevant content during streaming of the media, as described herein.

Node (1202) may also communicate with one or more external devices (1240), such as a sensor, a valve, etc.; a display (1250); one or more devices that enable a user to interact with node (1202); and/or any devices (e.g., network card, modem, etc.) that enable node (1202) to communicate with one or more other computing devices. Such communication can occur via Input/Output (I/O) interface(s) (1210). Still yet, node (1202) can communicate with one or more networks such as a local area network (LAN), a general wide area network (WAN), and/or a public network (e.g., the Internet) via network adapter (1230). As depicted, network adapter (1230) communicates with the other components of node (1202) via bus (1208). In one embodiment, a filesystem, such as a distributed storage system, may be in communication with the node (1202) via the I/O interface (1210) or via the network adapter (1230). It should be understood that although not shown, other hardware and/or software components could be used in conjunction with node (1202). Examples, include, but are not limited to: microcode, device drivers, redundant processing units, external disk drive arrays, RAID systems, tape drives, and data archival storage systems, etc.

In one embodiment, node (1202) is a node of a cloud computing environment. As is known in the art, cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models. Example of such characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load balancing between clouds).

A cloud computing environment is service oriented with a focus on statelessness, low coupling, modularity, and semantic interoperability. At the heart of cloud computing is an infrastructure comprising a network of interconnected nodes.

Figure 13:
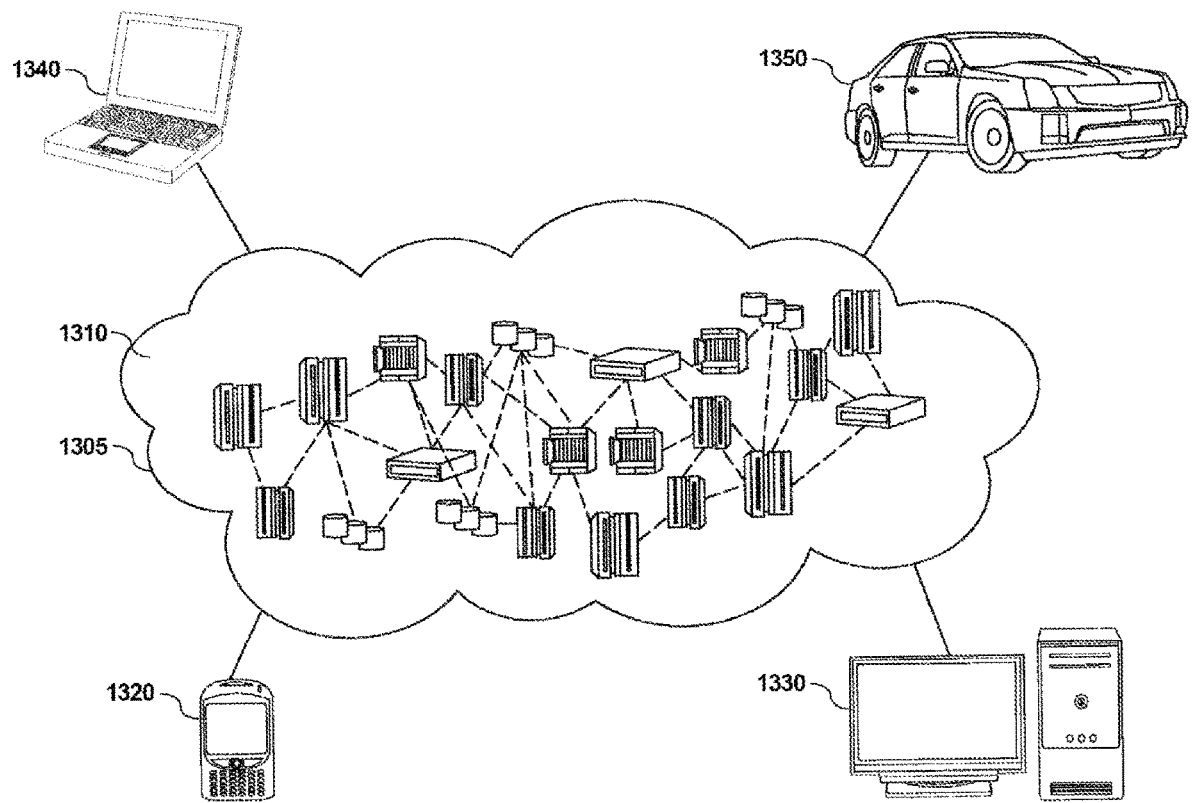
FIG. 13 depicts a block diagram illustrative of a cloud computing environment.

Referring now to FIG. 13, an illustrative cloud computing network (1300) is provided. As shown, cloud computing network (1300) includes a cloud computing environment (1305) having one or more cloud computing nodes (1310) with which local computing devices used by cloud consumers may communicate. Examples of these local computing devices include, but are not limited to, personal digital assistant (PDA) or cellular telephone (1320), desktop computer (1330), laptop or tablet computer (1340), and/or automobile computer system (1350). Individual nodes within nodes (1310) may further communicate with one another. They may be grouped (not shown) physically or virtually, in one or more networks, such as Private, Community, Public, or Hybrid clouds as described hereinabove, or a combination thereof. This allows cloud computing environment (1300) to offer infrastructure, platforms and/or software as services for which a cloud consumer does not need to maintain resources on a local computing device. It is understood that the types of computing devices (1320)-(1350) shown in FIG. 13 are intended to be illustrative only and that the cloud computing environment (1305) can communicate with any type of computerized device over any type of network and/or network addressable connection (e.g., using a web browser).

Figure 14:
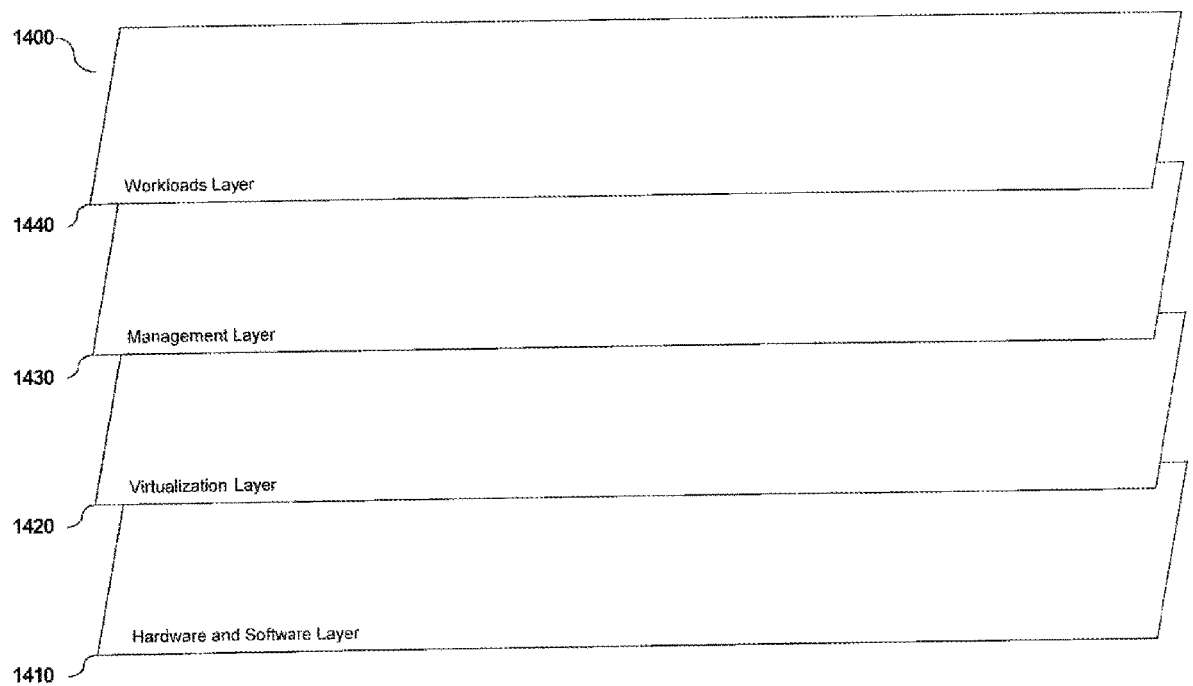
FIG. 14 depicts a block diagram illustrating a set of functional abstraction model layers provided by the cloud computing environment of FIG. 12.

Referring now to FIG. 14, a set of functional abstraction layers provided by cloud computing network (1400) is shown. It should be understood in advance that the components, layers, and functions shown in FIG. 14 are intended to be illustrative only, and the embodiments are not limited thereto. As depicted, the following layers and corresponding functions are provided: hardware and software layer (1410), virtualization layer (1420), management layer (1430), and workload layer (1440). The hardware and software layer (1410) includes hardware and software components. Examples of hardware components include servers, storage devices, networks and networking components. Examples of software components include network application server software, and database software.

Virtualization layer (1420) provides an abstraction layer from which the following examples of virtual entities may be provided: virtual servers; virtual storage; virtual networks, including virtual private networks; virtual applications and operating systems; and virtual clients.

In one example, management layer (1430) may provide the following functions: resource provisioning, metering and pricing, user portal, service level management, and SLA planning and fulfillment. Resource provisioning provides dynamic procurement of computing resources and other resources that are utilized to perform tasks within the cloud computing environment. Metering and pricing provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provides pre-arrangement for, and procurement of, cloud computing resources for which a future requirement is anticipated in accordance with an SLA.

Workloads layer (1440) provides examples of functionality for which the cloud computing environment may be utilized. Examples of workloads and functions which may be provided from this layer include, but are not limited to: mapping and navigation; software development and lifecycle management; virtual classroom education delivery; data analytics processing; transaction processing; and dynamic heat exchanger support within the cloud computing environment.

In the shared pool of configurable computer resources described herein, hereinafter referred to as a cloud computing environment, files may be shared among users within multiple data centers, also referred to herein as data sites. A series of mechanisms are provided within the shared pool to provide decision making controls for access to one or more records based upon associated record access and inherent characteristics of privacy. Three knowledge bases are employed with respect to consent management, including importance, sensitivity, and relevance. Analytical techniques employ the knowledge bases to assist with making access control decisions. By resourcing the control system to the cloud, or communication with the control system to the cloud, performance of the heat exchange system may be reported to any component that is in communication with the cloud resources. At the same time, modification of the valve position and/or settings may be directed from the shared resources. An instruction with an associated address may be directed to a specific valve to direct the position of the valve to change from a prior position, with the valve position change to influence fluid flow through the heat exchange system.

In this document, the terms "computer program medium," "computer usable medium," and "computer readable medium" are used to generally refer to media such as memory, removable storage drive, and a hard disk installed in hard disk drive.

Computer programs (also called computer control logic) are stored in main memory and/or secondary memory. Computer programs may also be received via a communication interface. Such computer programs, when run, enable the computer system to perform the features of the present embodiments as discussed herein. In particular, the computer programs, when run, enable the processor to perform the features of the computer system. Accordingly, such computer programs represent controllers of the computer system.

The present embodiments may be a system, a method, and/or a computer program product. The computer program product may include a computer readable storage medium (or media) having computer readable program instructions thereon for causing a processor to carry out aspects of the present embodiments.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present embodiments may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present embodiments.

Aspects of the present embodiments are described herein with reference to flowchart illustrations and/or block diagrams of methods, apparatus (systems), and computer program products according to the embodiments. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed.

Many modifications and variations will be apparent to those of ordinary skill in the art without departing from the scope and spirit of the embodiments. The embodiments were chosen and described in order to best explain the principles and the practical application, and to enable others of ordinary skill in the art to understand the embodiments with various modifications as are suited to the particular use contemplated. Accordingly, the implementation of pertains to convection ports within a cold plate to optimize the cooling of heat sources in contact thereto.

It will be appreciated that, although specific embodiments have been described herein for purposes of illustration, various modifications may be made without departing from the spirit and scope of the embodiments. Accordingly, the scope of protection of the embodiments is limited only by the following claims and their equivalents.

What is claimed is:

1. A system comprising:
    a primary body comprising a first exterior face having a fluid flow inlet and a separate fluid flow outlet, a second exterior face opposite to the first exterior face, and at least one interior wall extending between the first and second exterior faces, the at least one interior wall defining a chamber, the primary body configured to transfer heat away from one or more heat sources;
    a secondary body separate from the one or more heat sources and positioned in the chamber, the secondary body comprising an exterior surface surrounded by the chamber and having a fluid flow conduit comprising a convection port, the convection port providing communication between the fluid flow conduit and the chamber;
    an inlet plenum positioned at the first exterior face and communicating the fluid flow inlet and the fluid flow conduit with one another; and
    an outlet plenum positioned at the first exterior face and communicating the chamber and the fluid flow outlet with one another;
    the fluid flow conduit of the secondary body configured to receive fluid flow from the inlet plenum, pass the received fluid flow along the fluid flow conduit in a first direction, and discharge the fluid flow from the fluid flow conduit through the convection port and into the chamber of the primary body; and
    the chamber of the primary body configured to receive the fluid flow discharged through the convection port, disperse the received fluid flow outwardly from the convection port to surround the exterior surface of the secondary body, pass the dispersed fluid flow along the chamber of the primary body in a second direction opposite to the first direction as the fluid flow surrounds the exterior surface of the secondary body, and pass the dispersed fluid flow into the outlet plenum for discharge through the fluid flow outlet.

2. The system of claim 1, wherein the secondary body is an integral part of the primary body.

3. The system of claim 1, further comprising a fluid flow control in communication with the secondary body, the fluid flow control to adjust fluid flow through the secondary body.

4. The system of claim 3, further comprising a sensor in communication with the secondary body, the sensor to detect a characteristic associated with the secondary body and to report the detected characteristic to a control system, wherein the control system controls fluid flow responsive to the detected characteristic.

5. The system of claim 4, further comprising the control system in communication with the fluid flow control, the control system to adjust a position of the fluid flow control responsive to the detected characteristic.

6. The system of claim 4, further comprising positioning at least two secondary bodies in the chamber, including a first secondary body and a second secondary body, the control system to separately adjust fluid flow in each of the first and second secondary bodies.

7. The system of claim 4, further comprising positioning two secondary chambers in the chamber, including a first chamber and a second secondary chamber, and positioning a first secondary body in the first chamber and a second secondary body in the second chamber, the control system to separately adjust fluid flow in each of the first and second secondary bodies.

8. The system of claim 1, further comprising a nozzle positioned in communication with the convection port, the nozzle to direct fluid from the secondary body into the chamber.

9. The system of claim 1, further comprising the secondary body having a plurality of convection ports, wherein a shape of the ports is uniform or varied, and wherein the ports are positioned along a length of the secondary body, the position of the ports comprising uniform or varied.

10. The system of claim 1, further comprising at least two secondary bodies, including a first body and a second body, the first body having at least a first port and the second body having at least a second port, the first port having a first shape and the second port having a second shape, the first and second shapes comprising different shapes, similar shapes, different sizes, or similar sizes.

11. The system of claim 1, wherein the primary body comprises a cold plate having a cold plate surface configured to transfer heat away from one or more heat sources.

12. The system of claim 1, wherein the first direction is toward the second exterior face of the primary body, and wherein the second direction is toward the first exterior face of the primary body.

13. A system comprising:
    a primary body housing comprising a first exterior face having a fluid flow inlet and a separate fluid flow outlet, a second exterior face opposite to the first exterior face, and an interior wall extending between the first and second exterior faces, the interior wall defining an arcuate chamber, the primary body configured to transfer heat away from one or more heat sources;

an arcuate secondary body separate from the one or more heat sources and positioned in the arcuate chamber, the arcuate secondary body comprising an exterior surface surrounded by the arcuate chamber and having a fluid flow conduit comprising a convection port, the convection port providing communication between the fluid flow conduit and the arcuate chamber; and a fluid outlet positioned at the first exterior face and communicating the arcuate interior chamber and the fluid flow outlet with one another;

the fluid flow conduit of the arcuate secondary body configured to receive fluid flow from the fluid flow inlet, pass the received fluid flow along the fluid flow conduit in a first direction, and discharge the fluid flow from the fluid flow conduit through the convection port and into the arcuate chamber of the primary body; and the arcuate chamber of the primary body configured to receive the fluid flow discharged through the convection port, disperse the received fluid flow outwardly from the convection port to surround the exterior surface of the arcuate secondary body, pass the dispersed fluid flow along the arcuate chamber of the primary body in a second direction opposite to the first direction as the fluid flow surrounds the exterior surface of the arcuate secondary body, and pass the dispersed fluid flow for discharge through the fluid flow outlet.

14. The system of claim 13, further comprising a fluid flow control in communication with the arcuate secondary body, the fluid flow control to adjust fluid flow through the arcuate secondary body.

15. The system of claim 14, further comprising a sensor in communication with the arcuate secondary body, the sensor to detect a characteristic associated with the arcuate secondary body and to report the detected characteristic to a control system, wherein the control system controls fluid flow responsive to the detected characteristic.

16. The system of claim 15, further comprising the control system in communication with the fluid flow control, the control system to adjust a position of the fluid flow control responsive to the detected characteristic.

17. The system of claim 13, further comprising
an inlet plenum positioned at the first exterior face and communicating the fluid flow inlet and the fluid flow conduit with one another; and
an outlet plenum positioned at the first exterior face and communicating the arcuate chamber and the fluid flow outlet with one another.

18. The system of claim 13, wherein the primary body comprises a cold plate having a cold plate surface configured to transfer heat away from one or more heat sources.

19. The system of claim 13, wherein the first direction is toward the second exterior face of the primary body, and wherein the second direction is toward the first exterior face of the primary body.

* * * * *